United States Patent
Liao et al.

(10) Patent No.: US 9,309,108 B2
(45) Date of Patent: *Apr. 12, 2016

(54) MEMS MICROPHONE PACKAGING METHOD

(71) Applicant: LINGSEN PRECISION INDUSTRIES, LTD., Taichung (TW)

(72) Inventors: Hsien-Ken Liao, Taichung (TW); Ming-Te Tu, Taichung (TW)

(73) Assignee: LINGSEN PRECISION INDUSTRIES, LTD., Taichung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/531,222

(22) Filed: Nov. 3, 2014

(65) Prior Publication Data

US 2016/0052779 A1 Feb. 25, 2016

(30) Foreign Application Priority Data

Aug. 19, 2014 (TW) .............................. 103128417 A

(51) Int. Cl.
*H01L 21/00* (2006.01)
*B81C 1/00* (2006.01)
*H04R 1/08* (2006.01)

(52) U.S. Cl.
CPC ................ *B81C 1/0023* (2013.01); *H04R 1/08* (2013.01); *B81C 1/00301* (2013.01); *B81C 1/00357* (2013.01); *B81C 2203/037* (2013.01); *H04R 2201/003* (2013.01)

(58) Field of Classification Search
CPC ........................... H01L 2924/1461; H04R 3/00
See application file for complete search history.

(56) References Cited

U.S. PATENT DOCUMENTS

| | | | |
|---|---|---|---|
| 7,615,416 B1* | 11/2009 | Chock ........................... | 438/127 |
| 8,030,722 B1* | 10/2011 | Bolognia .............. | B81B 7/0061 |
| | | | 257/433 |
| 8,115,283 B1 | 2/2012 | Bolognia et al. | |
| 9,029,962 B1* | 5/2015 | Dreiza .................... | H01L 27/04 |
| | | | 257/416 |
| 2004/0262729 A1* | 12/2004 | Kumamoto ................... | 257/678 |
| 2007/0013036 A1* | 1/2007 | Zhe et al. ...................... | 257/659 |
| 2009/0315163 A1* | 12/2009 | Johnson et al. ............... | 257/676 |
| 2011/0140283 A1* | 6/2011 | Chandra et al. ............... | 257/777 |
| 2013/0106868 A1* | 5/2013 | Shenoy ......................... | 345/501 |
| 2015/0091108 A1* | 4/2015 | Huang et al. .................. | 257/417 |
| 2015/0117681 A1* | 4/2015 | Watson et al. ................ | 381/174 |

* cited by examiner

*Primary Examiner* — Steven Loke
*Assistant Examiner* — Samuel Park
(74) *Attorney, Agent, or Firm* — Muncy, Geissler, Olds & Lowe, P.C.

(57) ABSTRACT

A MEMS microphone packaging method includes the steps of: providing a substrate having a conducting part and a through hole; mounting a processor chip on the substrate and electrically connecting the processor chip to the conducting part; mounting a sensor chip on the substrate over the through hole and adjacent to the processor chip and electrically connecting the sensor chip to the processor chip; and mounting a cover on the substrate over the processor chip and the sensor chip. The cover has a conducting circuit, and the conducting circuit electrically coupled with the conducting part. Thus, the method of the invention can make a flip architecture MEMS microphone, reducing the steps of the packaging process and lowering the degree of difficulty of the manufacturing process and the manufacturing costs.

13 Claims, 4 Drawing Sheets

MEMS MICROPHONE PACKAGING METHOD

BACKGROUND OF THE INVENTION

1. Field of the Invention

The present invention relates to semiconductor packaging technology and more particularly, to a MEMS (micro-electromechanical system) microphone packaging method.

2. Description of the Related Art

For the advantages of excellent electrical properties and smaller size, MEMS (Micro-electromechanical Systems) microphones have been getting more and more attention in the field of electro-acoustic. When compared with conventional electrets condenser microphones, MEMS microphones have the advantages of high electrical stability, consistent quality, small package size and ease of the use of SMT (Surface Mount Technology), etc. Therefore, the application of MEMS microphones in the field of acoustics will be more and more widespread.

The commonly known MEMS microphone packaging method is to affix MEMS (Micro-electromechanical Systems) and ASIC (Application-specific Integrated Circuit) to a substrate using a die bonding process, and then to achieve conduction between MEMS/ASIC and an external signal using a wire bonding process, and then to mount a metal shell on the outside for shielding electromagnetic interference. This MEMS microphone packaging method needs to make a through hole on the metal shell or substrate for the transfer of acoustic signals to MEMS. For example, U.S. Pat. No. 8,115,283 discloses a semiconductor device, entitled "Reversible top/bottom MEMS package", which has a base substrate having a plurality of metal traces and a plurality of base vias. An opening is formed through the base substrate. At least one die is attached to the first surface of the substrate and positioned over the opening. A cover substrate has a plurality of metal traces. A cavity in the cover substrate forms side wall sections around the cavity. The cover substrate is attached to the base substrate so the at least one die is positioned in the interior of the cavity. Ground planes in the base substrate are coupled to ground planes in the cover substrate to form an RF shield around the at least one die.

The present invention provides a relatively simple method to reduce the degree of difficulty of the manufacturing process and the manufacturing costs.

SUMMARY OF THE INVENTION

The present invention has been accomplished under the circumstances in view. It is the main object of the present invention to provide a MEMS microphone packaging method, which can not only produce a flip architecture MEMS microphone but also significantly reduce the steps of the packaging process to lower the degree of difficulty of the manufacturing process and the manufacturing costs.

To achieve this and other objects of the present invention, a MEMS microphone packaging method of the invention comprises a first manufacturing process, a second manufacturing process and a third manufacturing process. The first manufacturing process comprises the steps of: A) providing a substrate comprising a conducting part and a through hole; B) mounting a processor chip on the substrate and electrically connecting the processor chip to the conducting part; C) mounting a sensor chip on the substrate over the through hole and adjacent to the processor chip and electrically connecting the sensor chip to the processor chip. The second manufacturing process comprises the steps of: A) providing a carrier board having a first solder pad, a second solder pad and a connection part; B) providing a retaining wall having a conducting circuit located between the conducting part and the first or second solder pad and electrically coupled to the conducting part, the first solder pad and the second solder pad; and C) fixedly mounting the retaining wall on the carrier board to form a cover. The third manufacturing process is to fixedly mount the cover of the second manufacturing process on the substrate of the first manufacturing process over the processor chip and the sensor chip.

Further, the retaining wall extends around the border of the carrier board to form therein an accommodation chamber for accommodating the processor chip and the sensor chip.

Step A) of the second manufacturing process further comprises the sub steps of: forming a first conductive layer on carrier board at one side of the connection part; forming a second conductive layer on the retaining wall at the side that is connected with the carrier board; and forming a third conductive layer on the retaining wall at the side that is connected with the substrate.

Preferably, each conductive layer of the second manufacturing process is made using screen printing or plate printing techniques.

The packaging method further comprises the step of using a compression heating process to cure each conductive layer, enabling the carrier board and the retaining wall, the retaining wall and the substrate to be respectively fixedly secured together.

Further, the conducting part of the first manufacturing process comprises a first contact, a second contact, a third contact and a fourth contact respectively connected to one another. The conducting circuit comprises a first lead wire, a second lead wire and a third lead wire. The connection part comprises a first leading point, a second leading point and a third leading point. The processor chip is electrically connected to the first contact. The first lead wire has two opposite ends thereof respectively electrically connected to the second contact and the first leading point. The second lead wire has two opposite ends thereof respectively electrically connected to the third contact and the second leading point. The third lead wire has two opposite ends thereof respectively electrically connected to the fourth contact and the third leading point. The first leading point is electrically connected to the first solder pad. The second leading point and the third leading point are respectively electrically connected to the second solder pad.

Preferably, the first manufacturing process further comprises a wire bonding process to electrically connect the processor chip and the first contact.

Preferably, the first manufacturing process further comprises a wire bonding process to electrically connect the sensor chip and the processor chip.

Preferably, the first manufacturing process further comprises the steps of: forming an adhesive layer on the substrate, and then mounting the processor chip on the adhesive layer, and then employing a baking process to cure the adhesive layer, bonding the processor chip to the substrate.

Preferably, the first manufacturing process further comprises the steps of: forming an adhesive layer on the substrate, and then mounting the sensor chip on the adhesive layer, and then employing a baking process to cure the adhesive layer, bonding the sensor chip to the substrate.

Preferably, the first manufacturing process further comprises the steps of: forming an adhesive layer on the substrate, and then mounting the processor chip and the sensor chip on the adhesive layer, and then employing a baking process to cure the adhesive layer, bonding the processor chip and the sensor chip to the substrate.

Preferably, the first manufacturing process further comprises the steps of: forming an encapsulant on one side of the processor chip opposite to the substrate, and then employing a baking process to cure the encapsulant.

Further, the sensor chip of the first manufacturing process is a micro-electromechanical system.

Further, the processor chip of the first manufacturing process is an application-specific Integrated circuit.

Thus, the MEMS microphone packaging method of the invention can make a flip architecture MEMS microphone to significantly reduce the steps of the packaging process, the degree of difficulty of the manufacturing process and the manufacturing costs.

Other advantages and features of the present invention will be fully understood by reference to the following specification in conjunction with the accompanying drawings, in which like reference signs denote like components of structure.

DETAILED DESCRIPTION OF THE INVENTION

Referring to FIGS. 1A through 1E, a method for packaging a MEMS (micro-electromechanical system) microphone 10 in accordance with the present invention is shown. The MEMS microphone packaging method comprises a first manufacturing process, a second manufacturing process and a third manufacturing process. The first manufacturing process comprises the steps of A, B and C.

Figure 1A:
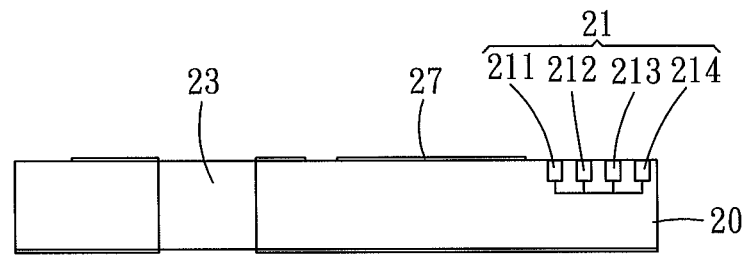
FIGS. 1A through 1E illustrate a first manufacturing process of a manufacturing flow of a MEMS microphone packaging method in accordance with the present invention.

Step A: As illustrated in FIG. 1A, provide a substrate 20 comprising a conducting part 21 and a through hole 23, wherein the conducting part 21 comprises a first contact 211, a second contact 212, a third contact 213 and a fourth contact 214 respectively kept in conduction with one another.

Figure 1B:
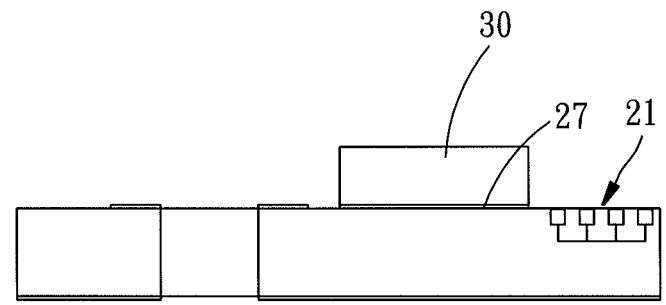
Figure 1C:
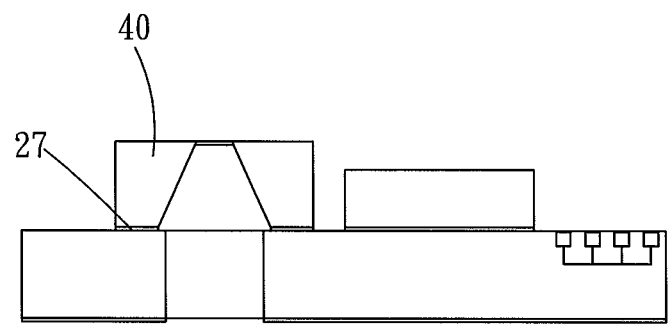
Figure 1D:
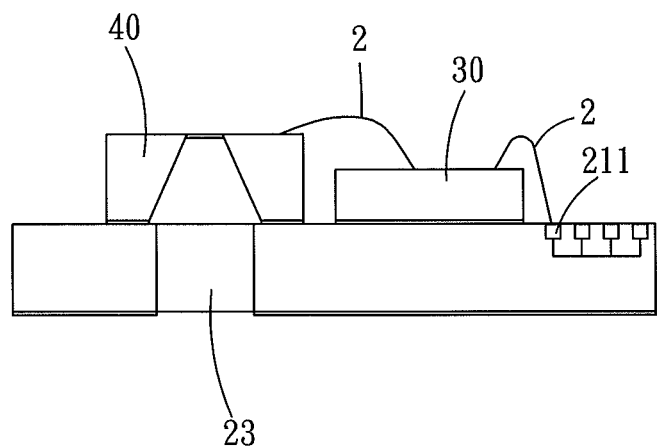

Step B: As illustrated in FIGS. 1B through 1D, mount a processor chip 30 on the substrate 20 and electrically connect the processor chip 30 to the conducting part 21, and then mount a sensor chip 40 on the substrate 20 over the through hole 23 and adjacent to the processor chip 30 and electrically connect the sensor chip 40 to the processor chip 30 for enabling an acoustic signal to be transmitted through the through hole 23 of the substrate 20 and then directly received by the sensor chip 40. In this embodiment, the above-mentioned electrical connection is done by means of a wire solder 2 using a wire bonding process. For example, the connection between the processor chip 30 and the first contact 211 is done using a wire bonding process; the connection between the sensor chip 40 and the processor chip 30 is done using a wire bonding process. Further, the sensor chip 40 is a micro-electromechanical system adapted for receiving an external acoustic signal and converting the received external acoustic signal into an electrical signal. The processor chip 30 is an application-specific integrated circuit designed and fabricated to meet the requirements of specific users and specific electronic systems, having the characteristics of small size, light weight, low power consumption, high reliability, enhanced privacy and low costs. Therefore, a microphone made using MEMS technology is also called as microphone chip or silicon microphone. The pressure sensitive film (not shown) in the micro-electromagnetic system is directly etched on the silicon chip using MEMS technology. The ASIC (application-specific integrated circuit) chip is normally integrated into a related circuit, such as pre-amplifier or analog-digital converter to form a digital microphone for outputting a digital signal directly to facilitate connection with modern digital circuits.

Figure 1E:
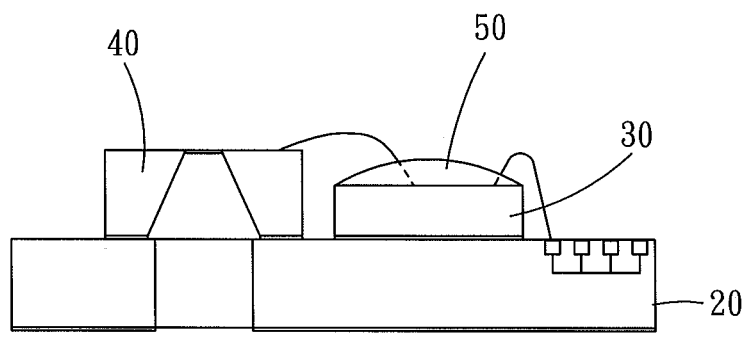

Step C: As illustrated in FIG. 1E, form an encapsulant 50 on one side of the processor chip 30 opposite to the substrate 20, and then employ a baking process to cure the encapsulant 50, thereby protecting the processor chip 30 and preventing each wire solder 2 from fracture.

Figure 2A:
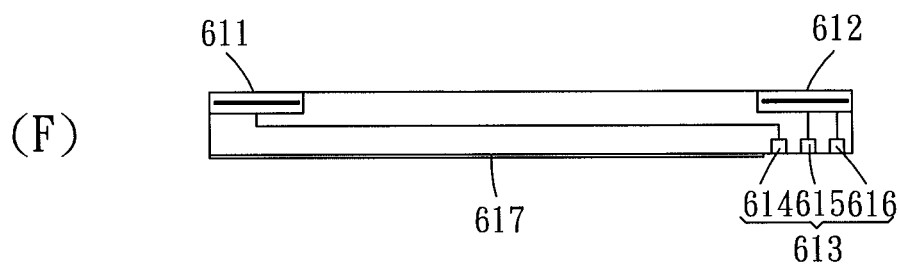
FIGS. 2A through 2C illustrate a second manufacturing process of the manufacturing flow of the MEMS microphone packaging method in accordance with the present invention.
Figure 2B:
Figure 2C:
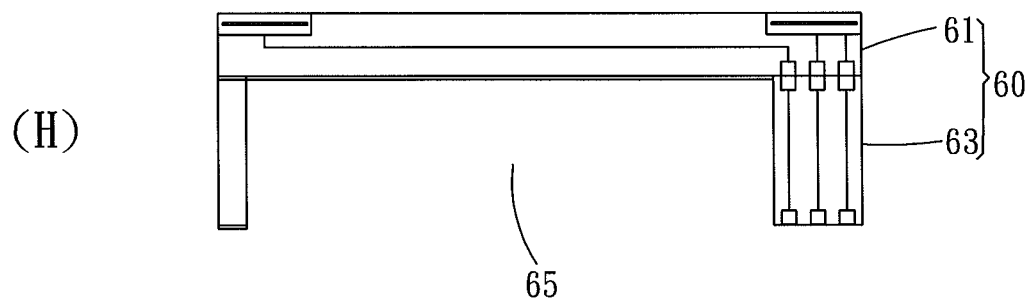

As illustrated in FIGS. 2A through 2C, the second manufacturing process comprises the step of D:

Step D: as illustrated in FIGS. 2A through 2C, provide a cover 60 comprising a carrier board 61 and a retaining wall 63. The carrier board 61 comprises a first solder pad 611, a second solder pad 612 and a connection part 613. The connection part 613 comprises a first leading point 614, a second leading point 615 and a third leading point 616. Further, the leading points 614,615,616 are set apart from one another. The retaining wall 63 comprises a conducting circuit 631 disposed between the second solder pad 612 of the carrier board 61 and the conducting part 21 of the substrate 20. The retaining wall 63 extends around the border of the carrier board 61, comprising an accommodation chamber 65 for accommodating the processor chip 30 and the sensor chip 40. The conducting circuit 631 comprises a first lead wire 632, a second lead wire 633 and a third lead wire 634. The retaining wall 63 is fixedly mounted at the carrier board 61 with the conducting circuit 631 electrically connected to the connection part 613. In electrical connection, the processor chip 30 is electrically connected to the first contact 211; the first lead wire 632 has two opposite ends thereof respectively electrically connected to the second contact 212 and the first leading point 614; the second lead wire 633 has two opposite ends thereof respectively electrically connected to the third contact 213 and the second leading point 615; the third lead wire 634 has two opposite ends thereof respectively electrically connected to the fourth contact 214 and the third leading point 616; the first leading point 614 is electrically connected to the first solder pad 611; the second leading point 615 and the third leading point 616 are respectively electrically connected to the second solder pad 612. More particularly, in order to have the carrier board 61 and the retaining wall 63 be firmly secured together to provide excellent electromagnetic interference shielding effects, the carrier board 61 is configured to provide a first conductive layer 617 located at the same side relative to the connection part 613, a second conductive layer 635 located at the retaining wall 63 at the side that is connected with the carrier board 61. However, the second conductive layer 635 can be eliminated if the first conductive layer 617 is sufficient to achieve stable connection between the carrier board 61 and the retaining wall 63 and to provide excellent electromagnetic interference shielding effects. At final, form a third conductive layer 636 at the retaining wall 63 at the side that is connected with the substrate 20. In the present preferred embodiment, each conductive layer 617, 635,636 is formed using a screen printing or plate printing technique. Further, in order to improve the efficacy of the present packaging method, an automatic machine (not shown) or manual tool (not shown) can be used to perform a compression heating process in curing the conductive layer 617,635,636, so that the carrier board 61 and the retaining wall 63 and the substrate 20 can be respectively firmly secured together to provide excellent electromagnetic interference shielding effects.

Figure 3:
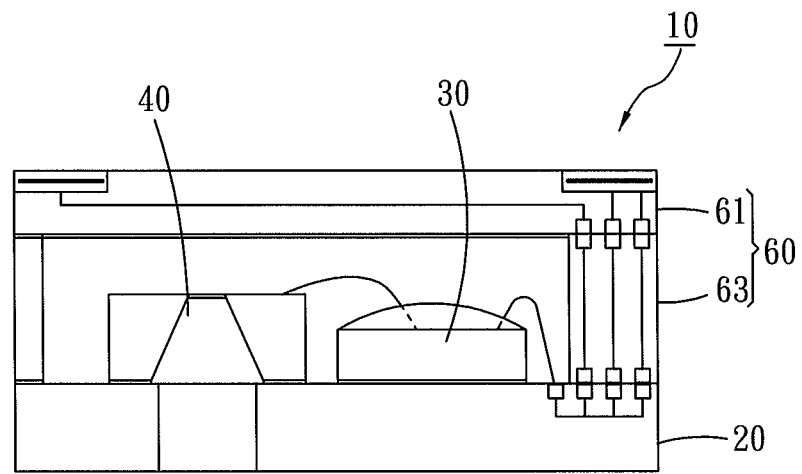
FIG. 3 illustrates a third manufacturing process of the manufacturing flow of the MEMS microphone packaging method in accordance with the present invention.
Figure 4:
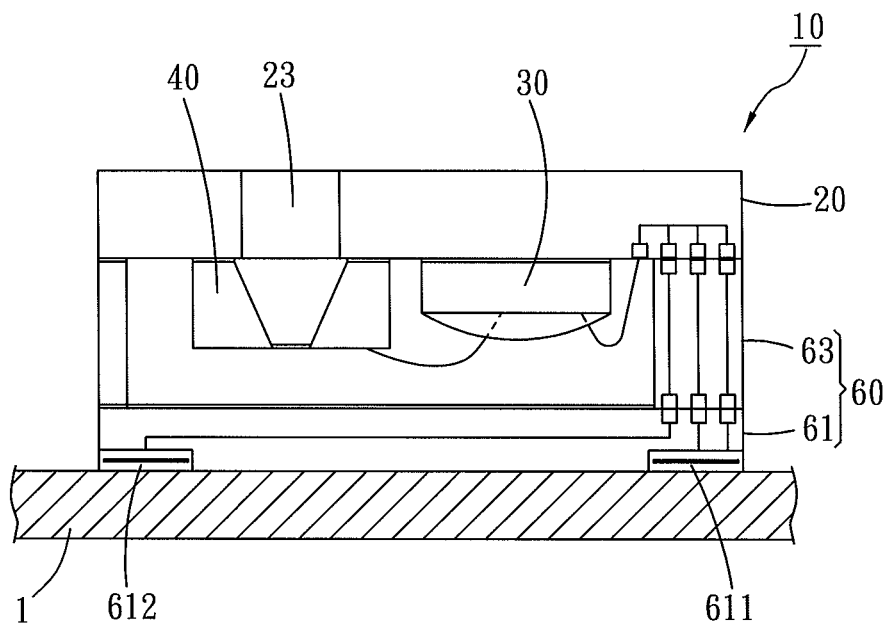
FIG. 4 is a schematic applied view illustrating a MEMS microphone made according to the present invention installed in a circuit board.

As illustrated in FIG. 3, the third manufacturing process of the present invention comprises the step of:

Step E: fixedly mount the cover 60 on the substrate 20 over the processor chip 30 and the sensor chip 40 to form an enclosed accommodation chamber 65 in the MEMS microphone 10 for receiving sound in one direction. Alternatively, a through hole (not shown) can be formed in the carrier board 61 to achieve bi-directional or omnidirectional sound-receiving effects. In the present preferred embodiment, as illustrated in FIG. 4, the MEMS microphone 10 is mounted on a circuit board 1 in an upside-down manner, i.e., the first solder pad 611 and second solder pad 612 of the carrier board 61 are located at the circuit board 1. By means of a reflow process, the first solder pad 611 and second solder pad 612 of the carrier board 61 are electrically coupled with the circuit board 1.

It's worth mentioning that in the preferred embodiment of the present invention, in order to reduce the manufacturing complexity and costs, an adhesive layer 25 can be formed on the substrate 20 prior to Step B. After formation of the adhesive layer 25, Step B is performed to mount the processor chip 30 and the sensor chip 40 on the adhesive layer 25. This step is determined subject to the capabilities of the equipment. Thereafter, employ a baking process to cure the adhesive layer 25, affixing the processor chip 30 and the sensor chip 40 to the substrate 20.

In conclusion, the MEMS microphone 10 packaging method enables the processor chip 30 and the sensor chip 40 to be arranged on the substrate 20, which has the aforesaid through hole 23, to form a flip architecture MEMS microphone 10. Through the conducting part 21, the preparation of the connection part 613 and the conducting circuit 631 greatly reduce the steps of the packaging process, thereby reducing the degree of difficulty of the manufacturing process and the manufacturing costs.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A MEMS microphone packaging method, comprising a first manufacturing process, a second manufacturing process and a third manufacturing process, wherein said first manufacturing process comprises the steps of:
   A) providing a substrate comprising a conducting part and a through hole;
   B) mounting a processor chip on said substrate and electrically connecting said processor chip to said conducting part; and
   C) mounting a sensor chip on said substrate over said through hole and adjacent to said processor chip and electrically connecting said sensor chip to said processor chip;
   said second manufacturing process comprising the steps of:
   A) providing a carrier board comprising a first solder pad, a second solder pad and a connection part;
   B) providing a retaining wall comprising a conducting circuit, said conducting circuit being disposed between said conducting part and one of said first solder pad and said second solder pad and electrically connected to said conducting part, said first solder pad and said second solder pad; and
   C) fixedly mounting said retaining wall at said carrier board to form a cover;
   said third manufacturing process is to fixedly mount said cover of said second manufacturing process on said substrate of said first manufacturing process over said processor chip and said sensor chip,
   wherein said conducting part of said first manufacturing process comprises a first contact, a second contact, a third contact and a fourth contact respectively connected with one another; said conducting circuit comprises a first lead wire, a second lead wire and a third lead wire; said connection part comprises a first leading point, a second leading point and a third leading point; said processor chip is electrically connected to said first contact; said first lead wire has two opposite ends thereof respectively electrically connected to said second contact and said first leading point; said second lead wire has two opposite ends thereof respectively electrically connected to said third contact and said second leading point; said third lead wire has two opposite ends thereof respectively electrically connected to said fourth contact and said third leading point; said first leading point is electrically connected to said second solder pad; said second leading point and said third leading point are respectively electrically connected to said first solder pad.

2. The MEMS microphone packaging method as claimed in claim 1, wherein said retaining wall extends around a border of said carrier board and defined with said carrier board an accommodation chamber for accommodating said processor chip and said sensor chip.

3. The MEMS microphone packaging method as claimed in claim 1, wherein Step A) of said second manufacturing process further comprises the sub steps of:
   forming a first conductive layer on said carrier board at one side of said connection part;
   forming a second conductive layer on said retaining wall at said retaining wall at the side that is connected with said carrier board; and
   forming a third conductive layer on said retaining wall at said retaining wall at the side that is connected with said substrate.

4. The MEMS microphone packaging method as claimed in claim 3, wherein each of said first, second and third conductive layers of said second manufacturing process is formed using one of screen printing and plate printing techniques.

5. The MEMS microphone packaging method as claimed in claim 3, wherein said second manufacturing process further comprises a compression heating process to cure each of said first, second and third conductive layers, securing said carrier board and said retaining wall and also said retaining wall and said substrate firmly together.

6. The MEMS microphone packaging method as claimed in claim 1, wherein said first manufacturing process further comprises a wire bonding process to electrically connect said processor chip and said first contact.

7. The MEMS microphone packaging method as claimed in claim 6, wherein said first manufacturing process further comprises a wire bonding process to electrically connect said sensor chip and said processor chip.

8. The MEMS microphone packaging method as claimed in claim 1, wherein said first manufacturing process further comprises the step of:
   forming an adhesive layer on said substrate, and then mounting said processor chip at said adhesive layer, and then employing a baking process to cure said adhesive layer and to have said processor chip be affixed to said substrate.

9. The MEMS microphone packaging method as claimed in claim 1, wherein said first manufacturing process further comprises the step of:
   forming an adhesive layer on said substrate, and then mounting said sensor chip at said adhesive layer, and then employing a baking process to cure said adhesive layer and to have said sensor chip be bonded to said substrate.

10. The MEMS microphone packaging method as claimed in claim 1, wherein said first manufacturing process further comprises the steps of:
   forming an adhesive layer on said substrate, and then mounting said processor chip and said sensor chip at said adhesive layer, and then employing a baking process to cure said adhesive layer and to have said processor chip and said sensor chip be bonded to said substrate.

11. The MEMS microphone packaging method as claimed in claim 1, wherein said first manufacturing process further comprises the steps of:
   forming an adhesive layer on one side of said processor chip opposite to said substrate, and then employing a baking process to cure said adhesive layer.

12. The MEMS microphone packaging method as claimed in claim 1, wherein said sensor chip of said first manufacturing process is a micro-electromechanical system.

13. The MEMS microphone packaging method as claimed in claim 1, wherein said processor chip of said first manufacturing process is an application-specific integrated circuit.

* * * * *